United States Patent
Sekiya et al.

(10) Patent No.: US 6,998,571 B2
(45) Date of Patent: Feb. 14, 2006

(54) LASER BEAM PROCESSING MACHINE

(75) Inventors: Kazuma Sekiya, Tokyo (JP); Toshiyuki Yoshikawa, Tokyo (JP)

(73) Assignee: Disco Corporation, Tokyo (JP)

( * ) Notice: Subject to any disclaimer, the term of this patent is extended or adjusted under 35 U.S.C. 154(b) by 165 days.

(21) Appl. No.: 10/827,284

(22) Filed: Apr. 20, 2004

(65) Prior Publication Data

US 2004/0211762 A1 Oct. 28, 2004

(30) Foreign Application Priority Data

Apr. 25, 2003 (JP) .................................... 2003-122215

(51) Int. Cl.
*B23K 26/00* (2006.01)

(52) U.S. Cl. .............................. 219/121.67; 219/121.82
(58) Field of Classification Search .............. 219/121.6, 219/121.67, 121.68, 121.69, 121.72, 121.82, 219/121.85, 121.86

See application file for complete search history.

(56) References Cited

U.S. PATENT DOCUMENTS

| 4,795,720 A | * | 1/1989 | Kawanabe et al. ......... 438/759 |
| 5,182,231 A | * | 1/1993 | Hongo et al. ............... 438/598 |
| 6,063,651 A | * | 5/2000 | Edelstein et al. ........... 438/132 |
| 6,703,075 B1 | * | 3/2004 | Lin et al. .................... 427/256 |

FOREIGN PATENT DOCUMENTS

JP        A 6-120334        4/1994

* cited by examiner

*Primary Examiner*—Samuel M. Heinrich
(74) *Attorney, Agent, or Firm*—Smith, Gambrell & Russell, LLP (57) ABSTRACT

A laser beam processing machine comprising a chuck table for holding a workpiece and a laser beam application means for applying a laser beam to the workpiece held on the chuck table, wherein the machine further comprises a protective film forming means for forming a protective film on the to-be-processed surface of the workpiece before laser beam processing.

5 Claims, 6 Drawing Sheets

LASER BEAM PROCESSING MACHINE

FIELD OF THE INVENTION

The present invention relates to a laser beam processing machine for carrying out a predetermined processing by applying a laser beam to a predetermined area of a workpiece.

DESCRIPTION OF THE PRIOR ART

As known to people of ordinary skill in the art, in the semiconductor device manufacturing process, individual semiconductor chips are manufactured by cutting a substantially disk-like semiconductor wafer having a plurality of areas sectioned by streets (cutting lines) arranged in a lattice pattern on its surface, and a circuit such as IC, LSI or the like formed in each of the sectioned areas, along the streets. Cutting along the streets of the semiconductor wafer is generally carried out by a cutting machine called "a dicer". This cutting machine comprises a chuck table for holding the semiconductor wafer as a workpiece, a cutting means for cutting the semiconductor wafer held on the chuck table, and a moving means for moving the chuck table and the cutting means relative to each other. The cutting means comprises a rotary spindle to be rotated at a high speed and a cutting blade mounted on the spindle. The cutting blade comprises a disk-like base, and an annular cutting edge fitted to the outer peripheral portion of the side surface of the base, and the cutting edge is formed as thick as about 20 $\mu$m by fixing diamond abrasive grains having a particle diameter of about 3 $\mu$m by electroforming. When the semiconductor wafer is cut with such a cutting blade, chips or cracks are produced on the cut surface of the semiconductor chip. Therefore, in consideration of the influence of these chips or cracks, the width of each street is set to about 50 $\mu$m. If the size of the semiconductor chip is reduced, however, the proportion of the streets to the semiconductor chip increases to cause reduction in productivity. In cutting with the cutting blade, further, problems are posed that the feed rate is limited and the semiconductor chips are contaminated with chips produced by cutting.

To form a finer IC or LSI circuit pattern in recent years, a semiconductor wafer in which a low dielectric constant insulating film (Low-k film) made of a film of an inorganic material such as SiOF or BSG (SiOB) or a film of an organic material such as polyimide-based or parylene-based polymer is laminated on the surface of the substrate of the semiconductor wafer such as a silicon wafer, and a semiconductor wafer having a metal pattern called "test element group (Teg)" applied thereon have been implemented. When the semiconductor wafer having the low dielectric constant insulating film (Low-k film) laminated thereon is cut with a cutting blade along the streets, there arises a problem that the Low-k film peels off. Or when the semiconductor wafer having a metal pattern called the test element group "Teg" applied thereto is cut with a cutting blade along streets, another problem arises that burrs are produced because the metal pattern is made of a tacky metal such as copper or the like.

Meanwhile, a method of cutting a semiconductor wafer by applying a laser beam along streets has been attempted and disclosed by JP-A 6-120334, for example.

Although since the method of cutting by applying a laser beam is to cut a semiconductor wafer along streets with a laser beam, it can solve the above problems that the Low-k film peels off and that burrs are produced, this method creates a new problem that when a laser beam is applied along the streets of the semiconductor wafer, thermal energy is concentrated on the exposed areas to produce debris which adhere to bonding pads that are connected to a circuit and the like, thereby reducing the quality of the semiconductor chip.

To prevent the influence of the debris which is produced by applying a laser beam to a workpiece, the applicant has proposed a laser beam processing method in which a protective film is formed on the surface to be processed of a workpiece and is removed after a laser beam is applied to the workpiece through the protective film, as Japanese patent application No. 2002-361882.

However, that a protective film forming apparatus for forming a protective film on the to-be-processed surface of a workpiece and a laser beam processing machine for applying a laser beam to the workpiece through the protective film are independently installed is not always efficient from the viewpoints of a factory space and the conveyance of a workpiece between apparatuses.

SUMMARY OF THE INVENTION

It is an object of the present invention to provide a laser beam processing machine having the function of forming a protective film on the surface to be processed of a workpiece.

To attain the above object, according to the present invention, there is provided a laser beam processing machine comprising a chuck table for holding a workpiece and a laser beam application means for applying a laser beam to the workpiece held on the chuck table, wherein the machine further comprises a protective film forming means for forming a protective film on a surface to be processed of the workpiece before the laser beam processing.

The above protective film forming means comprises a spinner table that holds the workpiece and rotates and a resin solution supply means for supplying a liquid resin solution to the to-be-processed surface of the workpiece held on the spinner table. Preferably, the liquid resin solution supplied by the above resin solution supply means is water-soluble. Preferably, the above protective film forming means comprises a cleaning water supply means for supplying cleaning water to the to-be-processed surface of the workpiece held on the spinner table.

Other features of the present invention will become apparent from the following description.

DETAILED DESCRIPTION OF THE PREFERRED EMBODIMENTS

Preferred embodiments of a laser beam processing machine constituted according to the present invention will be described in detail hereinbelow with reference to the accompanying drawings.

Figure 1:
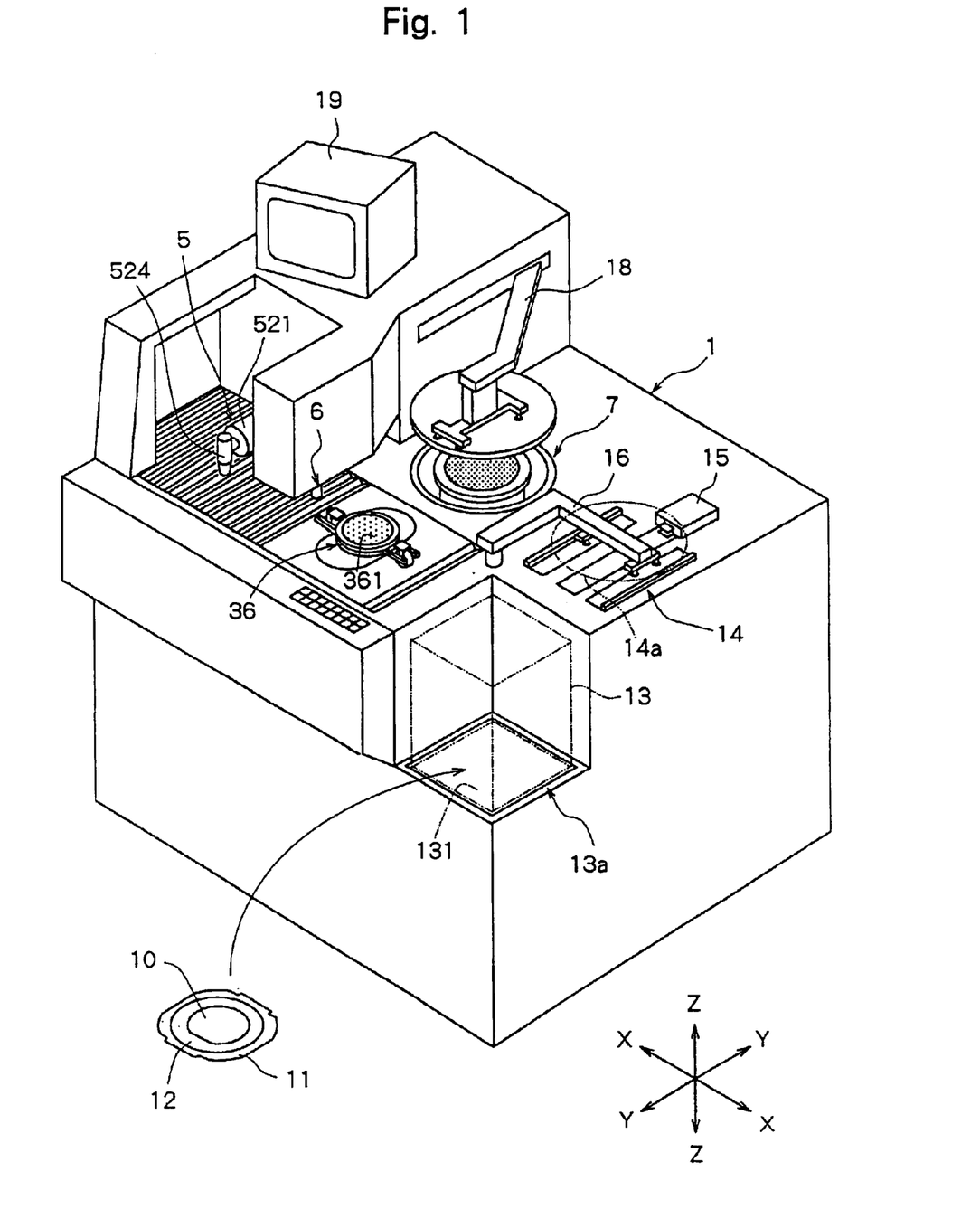
FIG. 1 is a perspective view of a laser beam processing machine constituted according to the present invention.

FIG. 1 is a perspective view of the laser beam processing machine constituted according to the present invention. The laser beam processing machine shown in FIG. 1 comprises a substantially rectangular parallelepiped housing 1. In this housing 1, there are installed a stationary base 2 shown in FIG. 2, a chuck table unit 3 for holding a workpiece, which is mounted on the stationary base 2 in such a manner that it can move in a direction indicated by an arrow X, a laser beam application unit support mechanism 4 arranged on the stationary base 2 in such a manner that it can move in a direction indicated by an arrow Y perpendicular to the direction indicated by the arrow X, and a laser beam application unit 5 arranged on the laser beam application unit support mechanism 4 in such a manner that it can move in a direction indicated by an arrow Z.

Figure 2:
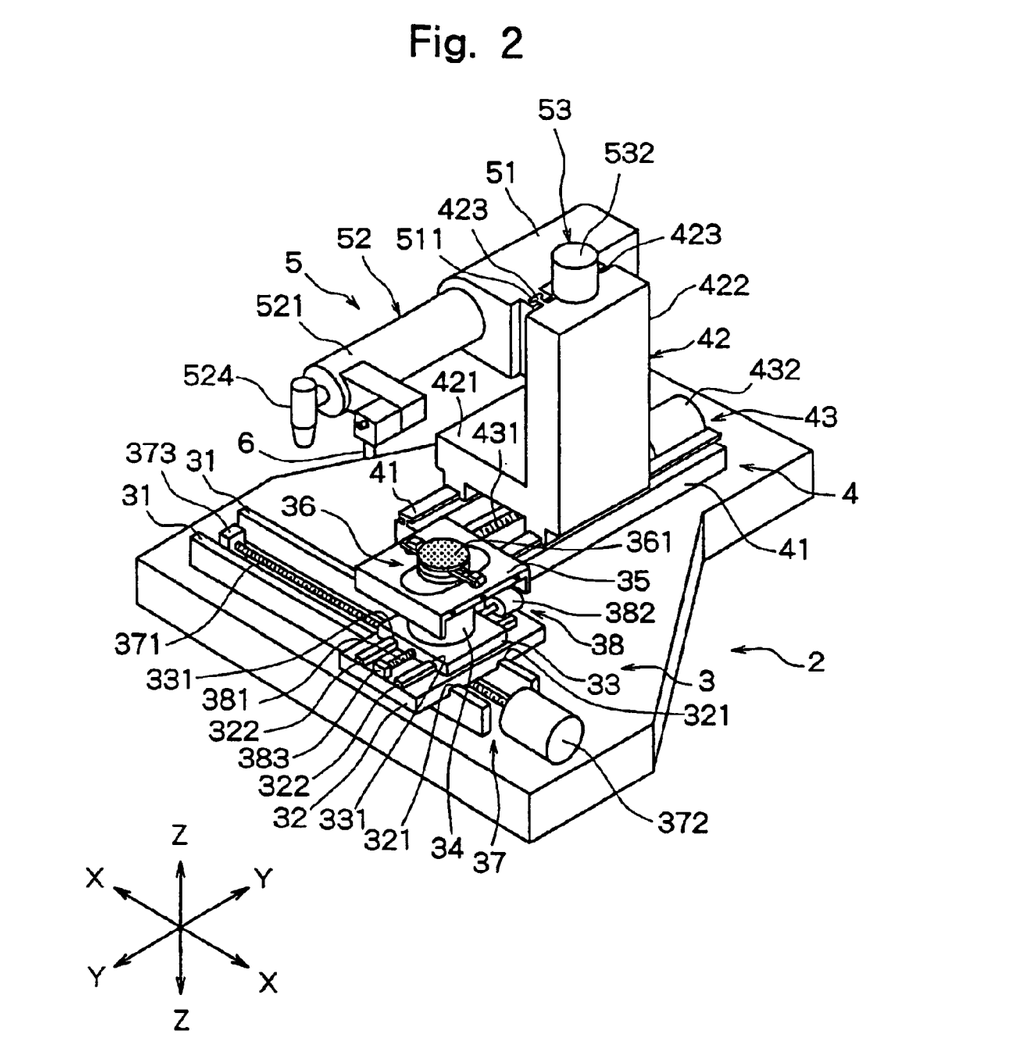
FIG. 2 is a perspective view of the main constituents of the laser beam processing machine shown in FIG. 1.

The above chuck table unit 3 comprises a pair of guide rails 31 and 31 mounted on the stationary base 2 and arranged parallel to each other in the direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the direction indicated by the arrow Y, a support table 35 supported on the second sliding block 33 by a cylindrical member 34, and a chuck table 36 as workpiece holding means. This chuck table 36 has an adsorption chuck 361 made of a porous material so that a disk-like semiconductor wafer as a workpiece is held on the adsorption chuck 361 by a suction means that is not shown. The chuck table 36 is rotated by a pulse motor (not shown) arranged in the cylindrical member 34.

The above first sliding block 32 has, on its under surface, a pair of to-be-guided grooves 321 and 321 to be fitted to the above pair of guide rails 31 and 31 and, on its top surface, a pair of guide rails 322 and 322 formed parallel to each other in the direction indicated by the arrow Y. The first sliding block 32 constituted as described above is so constituted as to be moved in the direction indicated by the arrow X along the pair of guide rails 31 and 31 by fitting the to-be-guided grooves 321 and 321 onto the pair of guide rails 31 and 31. The chuck table unit 3 in the illustrated embodiment is provided with a moving means 37 for moving the first sliding block 32 along the pair of guide rails 31 and 31 in the direction indicated by the arrow X. The moving means 37 comprises a male screw rod 371 arranged between the above pair of guide rails 31 and 31 and in parallel thereto and a drive source such as a pulse motor 372 for rotary-driving the male screw rod 371. The male screw rod 371 is, at its one end, rotatably supported to a bearing block 373 fixed on the above stationary base 2 and is, at the other end, transmission-connected to the output shaft of the above pulse motor 372 by a speed reducer that is not shown. The male screw rod 371 is screwed into a threaded through hole formed in a female screw block (not shown) projecting from the under surface of the center portion of the first sliding block 32. Therefore, by driving the male screw rod 371 in a normal direction or a reverse direction by the pulse motor 372, the first sliding block 32 is moved along the guide rails 31 and 31 in the direction indicated by the arrow X.

The above second sliding block 33 has, on its under surface, a pair of to-be-guided grooves 331 and 331 to be fitted to the pair of guide rails 322 and 322 provided on the upper surface of the above first sliding block 32, and is so constituted as to be moved in the direction indicated by the arrow Y by fitting the to-be-guided grooves 331 and 331 onto the pair of guide rails 322 and 322. The chuck table unit 3 in the illustrated embodiment is provided with a moving means 38 for moving the second sliding block 33 in the direction indicated by the arrow Y along the pair of guide rails 322 and 322 provided on the first sliding block 32. The moving means 38 comprises a male screw rod 381 arranged between the above pair of guide rails 322 and 322 and in parallel thereto, and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-connected to the output shaft of the above pulse motor 382 by a speed reducer that is not shown. The male screw rod 381 is screwed into a threaded through hole formed in a female screw block (not shown) projecting from the under surface of the center portion of the second sliding block 33. Therefore, by driving the male screw rod 381 in a normal direction or a reverse direction by the pulse motor 382, the second sliding block 33 is moved along the guide rails 322 and 322 in the direction indicated by the arrow Y.

The above laser beam application unit support mechanism 4 has a pair of guide rails 41 and 41 arranged, on the stationary base 2, in parallel along the index-feeding direction indicated by the arrow Y and a movable support base 42 arranged on the guide rails 41 and 41 in such a manner that it can move in the direction indicated by the arrow Y. This movable support base 42 comprises a movable support portion 421 movably arranged on the guide rails 41 and 41 and a mounting portion 422 mounted on the movable support portion 421. The mounting portion 422 has, on one side surface, a pair of guide rails 423 and 423 provided in parallel and extending in the direction indicated by the arrow Z. The laser beam application unit support mechanism 4 in the illustrated embodiment is provided with a moving means 43 for moving the movable support base 42 along the pair of guide rails 41 and 41 in the index-feeding direction indicated by the arrow Y. This moving means 43 comprises a male screw rod 431 arranged between the above pair of guide rails 41 and 41 and in parallel thereto, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-connected to the output shaft of the above pulse motor 432 by a speed reducer that is not shown. The male screw rod 431 is screwed into a threaded through hole formed in a female screw block (not shown) projecting from the under surface of the center portion of the movable support portion 421 constituting the movable support base 42. Therefore, by driving the male screw rod 431 in a normal direction or a reverse direction by the pulse motor 432, the movable support base 42 is moved along the guide rails 41 and 41 in the index-feeding direction indicated by the arrow Y.

The laser beam application unit 5 in the illustrated embodiment has a unit holder 51 and a laser beam application means 52 secured to the unit holder 51. The unit holder 51 is provided with a pair of to-be-guided grooves 511 and 511 to be slidably fitted onto the pair of guide rails 423 and 423 provided on the above mounting portion 422, and is supported in such a manner that it can move in the direction indicated by the arrow Z by fitting the to-be-guided grooves 511 and 511 onto the above guide rails 423 and 423.

Figure 3:
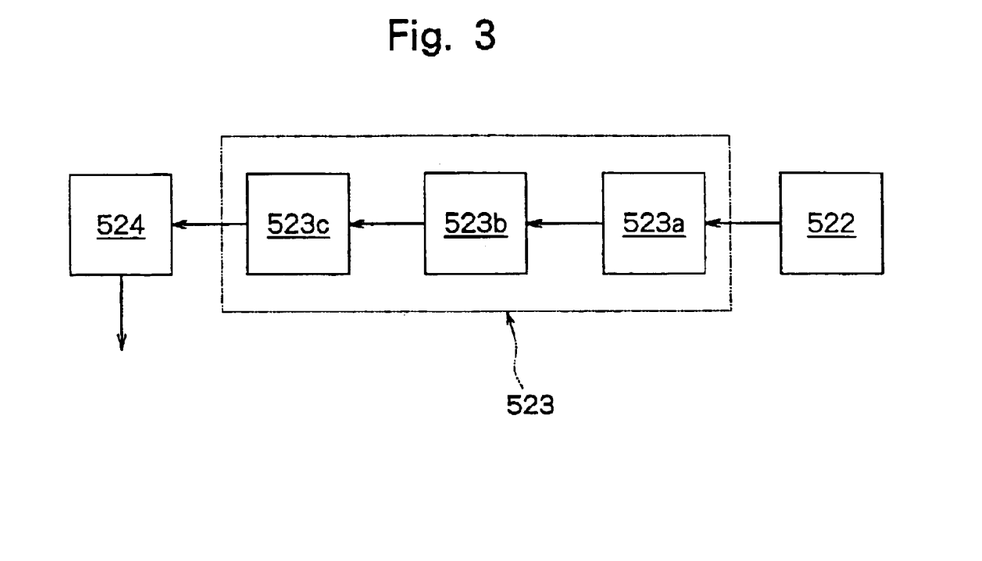
FIG. 3 is a block diagram schematically showing the constitution of the laser beam application means of the laser beam processing machine shown in FIG. 1.

The illustrated laser beam application means 52 comprises a cylindrical casing 521 that is secured to the above unit holder 51 and extends substantially horizontally. In the casing 521, there are installed a laser beam oscillation means 522 and a laser beam modulation means 523 as shown in FIG. 3. A YAG laser oscillator or YVO4 laser oscillator may be used as the laser beam oscillation means 522. The laser beam modulation means 523 comprises a repetition frequency setting means 523a, a laser beam pulse width setting means 523b and a laser beam wavelength setting means 523c. The repetition frequency setting means 523a, laser beam pulse width setting means 523b and laser beam wavelength setting means 523c constituting the laser beam modulation means 523 may be of types known to people of ordinary skill in the art and therefore, detailed descriptions of their structures are omitted in this text. A optical condenser 524 which may be of types known per se is attached to the end of the above casing 521.

A laser beam oscillated from the above laser beam oscillation means 522 arrives at the optical condenser 524 via the laser beam modulation means 523. In the laser beam modulation means 523, the repetition frequency setting means 523a converts the laser beam into a pulse laser beam having a predetermined repetition frequency, the laser beam pulse width setting means 523b sets the pulse width of the pulse laser beam at a predetermined width, and the laser beam wavelength setting means 523c sets the wavelength of the pulse laser beam at a predetermined value.

An image pick-up means 6 is arranged at a front end of the casing 521 constituting the above laser beam application means 52. In the illustrated embodiment, the image pick-up means 6 is constituted by an ordinary image pick-up device (CCD) for picking up an image with visible radiation and an infrared CCD for picking up an image with infrared radiation, either of which can be selected appropriately. Besides these, there are installed an illuminating means for illuminating the workpiece and an optical system for capturing an area illuminated by the illuminating means. An image taken by the optical system is transmitted to the image pick-up device (CCD or infrared CCD) to be converted into an electrical image signal, which is then transmitted to a control means that is not shown.

The laser beam application unit 5 in the illustrated embodiment has a moving means 53 for moving the unit holder 51 along the pair of guide rails 423 and 423 in the direction indicated by the arrow Z. Like the aforementioned moving means, the moving means 53 comprises a male screw rod (not shown) arranged between the pair of guide rails 423 and 423, and a drive source such as a pulse motor 532 for rotary-driving the male screw rod. By driving the male screw rod (not shown) in a normal direction or a reverse direction by the pulse motor 532, the unit holder 51 and the laser beam application means 52 are moved along the guide rails 423 and 423 in the direction indicated by the arrow Z.

Figure 4:
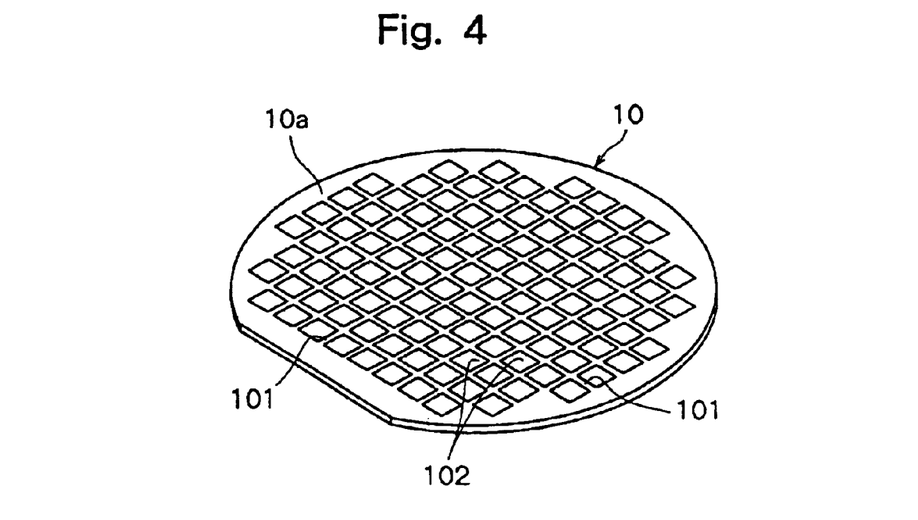
FIG. 4 is a perspective view of a semiconductor wafer as a workpiece to be processed by the laser beam processing machine of the present invention.

Returning to FIG. 1, the laser beam processing machine in the illustrated embodiment has a cassette placing portion 13a for placing a cassette for storing a semiconductor wafer 10 as a workpiece. A cassette table 131 is arranged on the cassette placing portion 13a in such a manner that it can be moved vertically by a lifting means (not shown), and a cassette 13 is placed on this cassette table 131. The semiconductor wafer 10 is mounted on an annular frame 11 by a protective tape 12 and stored in the above cassette 13 in a state of being mounted on the frame 11. A plurality of areas of the semiconductor wafer 10 are sectioned by a plurality of streets (cutting lines) 101 formed on the surface 10a in a lattice pattern as shown in FIG. 4, and a circuit 102 such as IC, LSI or the like is formed in each of the sectioned areas. The rear surface of the semiconductor wafer 10 thus constituted is affixed to the protective tape 12 mounted on the annular frame 11 in such a manner that the surface 10a, that is, the surface having the street 101 and circuit 102 formed thereon faces up.

With reference to FIG. 1, the laser beam processing machine in the illustrated embodiment has a temporary depot portion 14a for temporarily storing the semiconductor wafer 10 as a workpiece stored in the cassette 13, and a positioning means 14 for positioning the workpiece is disposed on the temporary depot portion 14a. The laser beam processing machine in the illustrated embodiment has a protective film forming/cleaning means 7 for forming a protective film on the surface to be processed of the semiconductor wafer 10 as a workpiece before processing and cleaning the semiconductor wafer 10 after processing. This protective film forming/cleaning means 7 will be described in detail later.

The laser beam processing machine in the illustrated embodiment comprises a workpiece take-in/take-out means 15 for taking out the semiconductor wafer 10 before processing, stored in the above cassette 13 to the positioning means 14 situated on the temporary depot portion 14a and taking the semiconductor wafer 10 after processing into the cassette 13, a workpiece conveying means 16 for carrying the semiconductor wafer 10 before processing from the positioning means 14 to the protective film forming/cleaning means 7 and for carrying the semiconductor wafer 10 having a protective film formed on the to-be-processed surface by the protective film forming/cleaning means 7 onto the above chuck table 36, and a cleaning/conveying means 18 for carrying the semiconductor wafer 10 after laser beam processing on the chuck table 36 to the protective film forming/cleaning means 7. The laser beam processing machine in the illustrated embodiment further comprises a display means 19 for displaying an image picked up by the above image pick-up means 6.

A description is subsequently given of the protective film forming/cleaning means 7 with reference to FIGS. 5 to 7.

The protective film forming/cleaning means 7 in the illustrated embodiment comprises a spinner table unit 71 and a cleaning water receiving means 72 arranged in such a manner to surround the spinner table unit 71. The spinner table unit 71 comprises a spinner table 711, an electric motor 712 for rotary-driving the spinner table 711, and a support means 713 for supporting the electric motor 712 in such a manner that it can move in a vertical direction. The spinner table 711 has an adsorption chuck 711a that is made of a porous material and is communicated with a suction means that is not shown. Therefore, by placing the workpiece on the adsorption chuck 711a of the spinner table 711 and exerting negative pressure onto the workpiece by means of a suction means that is not shown, the work piece is held on the adsorption chuck 711. The spinner table 711 is connected to the upper end of the drive shaft 712a of the electric motor 712. The above support means 713 comprises a plurality of (3 in the illustrated embodiment) support legs 713a and a plurality of (3 in the illustrated embodiment) air cylinders 713b that each are linked with the respective support legs 713a and attached to the electric motor 712. The support means 713 thus constituted activates the air cylinders 713b to move the electric motor 712 and the spinner table 711 to a workpiece take-in/take-out position which is an upper position in FIG. 6 or to a working position which is a lower position in FIG. 7.

Figure 5:
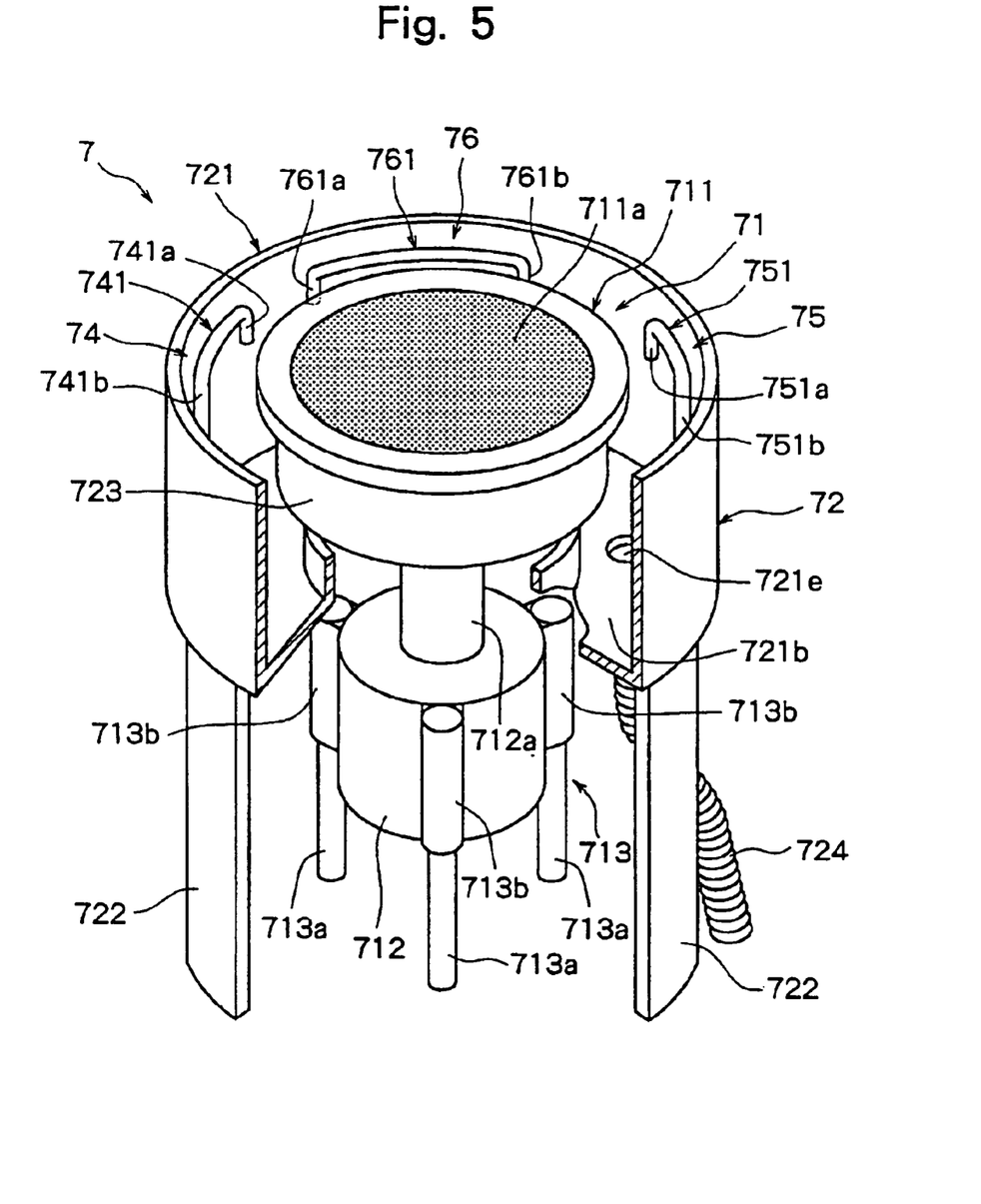
FIG. 5 is a partially broken and perspective view of the protective film forming/cleaning means of the laser beam processing machine shown in FIG. 1.

The above cleaning water receiving means 72 comprises a cleaning water receiving vessel 721, three (two are shown in FIG. 5) support legs 722 for supporting the cleaning water receiving vessel 721, and a cover member 723 fitted onto the drive shaft 712a of the above electric motor 712. The above cleaning water receiving vessel 721 consists of a cylindrical outer wall 721a, a bottom wall 721b and an inner wall 721c as shown in FIG. 6 and FIG. 7. A hole 721d in which the drive shaft 712a of the above electric motor 712 is inserted is formed in the center portion of the bottom wall 721b, and the inner wall 721c projects upward from the periphery of this hole 721d. As shown in FIG. 5, a discharge port 721e is formed in the bottom wall 721b, and a drain hose 724 is connected to this discharge port 721e. The above cover member 723 is formed in a disk-shape and has a cover portion 723a projecting downward from its periphery. When the electric motor 712 and the spinner table 711 are brought to the working position shown in FIG. 7, the cover portion 723a of the cover member 723 thus constituted covers the inner wall 721c constituting the above cleaning water receiving vessel 721 with a gap therebetween.

The protective film forming/cleaning means 7 in the illustrated embodiment has a resin solution supply means 74 for supplying a liquid resin solution to the to-be-processed surface of the semiconductor wafer 10 before processing, held on the above spinner table 711. The resin solution supply means 74 comprises a resin supply nozzle 741 for supplying a liquid resin solution toward the to-be-processed surface of the semiconductor wafer 10 before processing, held on the spinner table 711 and an electric motor 742 that is capable of turning in a normal direction and reverse direction and operates to swing the resin supply nozzle 741. The resin supply nozzle 741 is connected to a resin solution supply source that is not shown. The resin supply nozzle 741 consists of a nozzle portion 741a extending horizontally and a support portion 741b extending downward from the nozzle portion 741a. The support portion 741b is inserted into an insertion hole (not shown) formed in the bottom wall 721b constituting the above cleaning water receiving vessel 721 and is connected to the resin solution supply source that is not shown. A sealing member (not shown) for sealing the gap between the inner wall of the insertion hole and the support portion 741b is provided on the inner wall of the insertion hole (not shown) into which the support portion 741b of the resin supply nozzle 741 is inserted.

The protective film forming/cleaning means 7 in the illustrated embodiment has a cleaning water supply means 75 for cleaning the semiconductor wafer 10 after processing, held on the above spinner table 711 and an air supply means 76. The cleaning water supply means 75 has a cleaning water nozzle 751 for ejecting cleaning water toward the semiconductor wafer 10 after processing, held on the spinner table 711 and an electric motor 752 that can turn in a normal direction and reverse direction and operates to swing the cleaning water supply nozzle 751. The cleaning water nozzle 751 is connected to a cleaning water supply source that is not shown. The cleaning water nozzle 751 consists of a nozzle portion 751a extending horizontally and a support portion 751b extending downward from the nozzle portion 751a. The support portion 751b is inserted into an insertion hole (not shown) formed in the bottom wall 721b constituting the above cleaning water receiving vessel 721 and is connected to the cleaning water supply source that is not shown. A sealing member (not shown) for sealing the gap between the inner wall of the insertion hole and the support portion 751b is provided on the inner wall of the insertion hole (not shown) into which the support portion 751b of the cleaning water nozzle 751 is inserted.

The above air supply means 76 comprises an air nozzle 761 for ejecting air toward the semiconductor wafer 10 after processing, held on the spinner table 711 and an electric motor (not shown) that can turn in a normal direction and reverse direction and operates to swing the air supply nozzle 761. The air nozzle 761 is connected to an air supply source that is not shown and consists of a nozzle portion 761a extending horizontally and a support portion 761b extending downward from the nozzle portion 761a, which is inserted into an insertion hole (not shown) formed in the bottom wall 721b constituting the above cleaning water receiving vessel 721 and connected to an air supply source that is not shown. A sealing member (not shown) for sealing the gap between the inner wall of the insertion hole and the support portion 761b is provided on the inner wall of the insertion hole (not shown) into which the support portion 761b of the air nozzle 761 is inserted.

The laser beam processing machine in the illustrated embodiment is constituted as described above, and its operation will be described hereinunder.

As shown in FIG. 1, the semiconductor wafer 10 before processing supported on the annular frame 11 by the protective tape 12 (to be simply referred to as "semiconductor wafer 10" hereinafter) is stored at a predetermined position of the cassette 13 in such a manner that the surface 10a that is the to-be-processed surface, that is, the surface having the street 101 and circuit 102 formed thereon faces up. The semiconductor wafer 10 before processing stored at the predetermined position of the cassette 13 is brought to a take-out position by the vertical movement of the cassette table 131 by means of a lifting means that is not shown. Then, the semiconductor wafer 10 positioned to the take-out position is carried to a positioning means 14 arranged on the temporary depot portion 14a by the horizontal movement of the workpiece take-in/take-out means 15. The semiconductor wafer 10 carried to the positioning means 14 is brought to a predetermined position by the positioning means 14. Thereafter, the semiconductor wafer 10 before processing positioned by the positioning means 14 is carried onto the adsorption chuck 711a of the spinner table 711 constituting the protective film forming/cleaning means 7 by the turning motion of the workpiece conveying means 16 and suction-held on the adsorption chuck 711a. At this point, the spinner table 711 is brought to the workpiece take-in/take-out position shown in FIG. 6, and the resin supply nozzle 741, the cleaning water nozzle 751 and the air nozzle 761 are situated at a stand-by position away from the top of the spinner table 711 as shown in FIG. 5 and FIG. 6.

Figure 7:
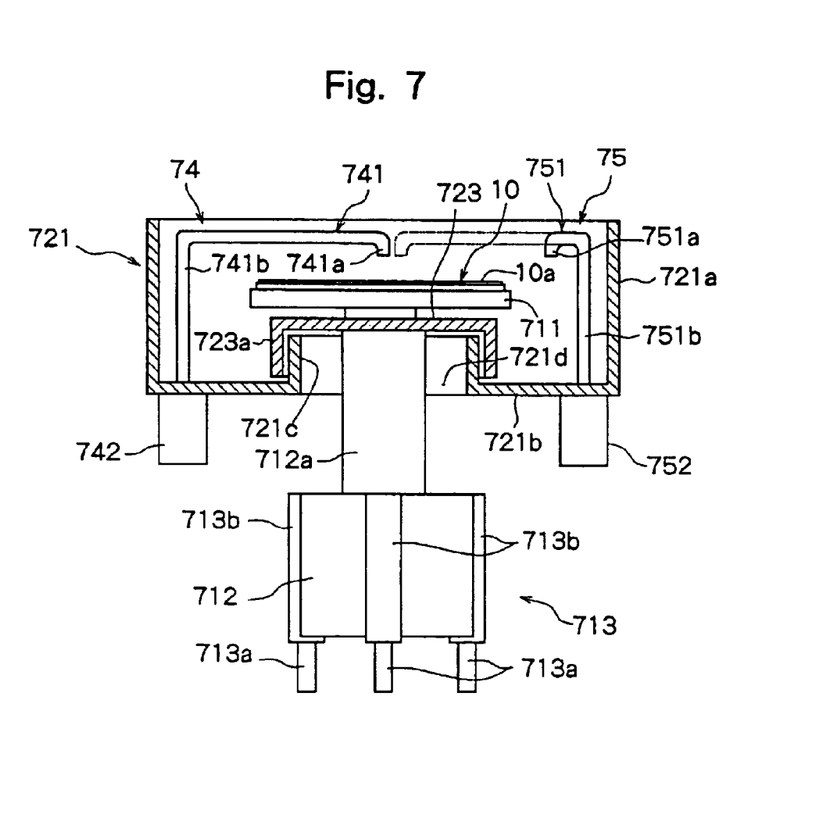
FIG. 7 is an explanatory diagram showing a state of the spinner table of the protective film forming/cleaning means shown in FIG. 5 being located at a working position.
Figure 8:
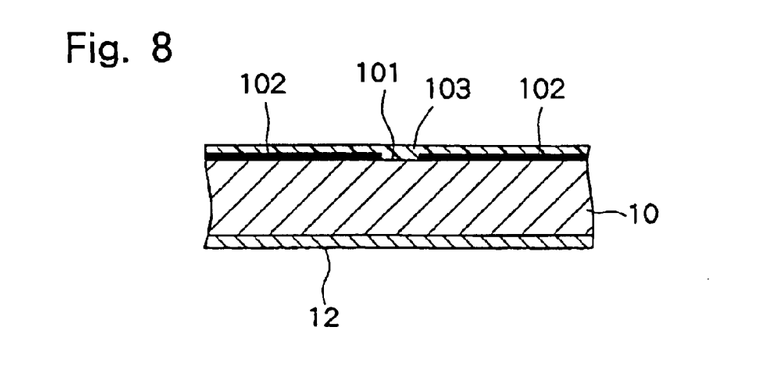
FIG. 8 is an enlarged sectional view of the principal portion of a semiconductor wafer as a workpiece covered with a protective film in the step of forming a protective film.

When the semiconductor wafer 10 before processing is held on the spinner table 711 of the protective film forming/cleaning means 7, the step of forming a protective film on the surface 10a, which is the to-be-processed surface, of the semiconductor wafer 10 is performed. To carry out the step of forming a protective film, the spinner table 711 is first brought to the working position as shown in FIG. 7, and the ejection port of the nozzle portion 741a of the resin supply nozzle 741 is brought to a position above the center portion of the semiconductor wafer 10 held on the spinner table 711 by activating the electric motor 742 of the resin solution supply means 74. The liquid resin is dripped on the center portion of the surface 10a, which is the to-be-processed surface, of the semiconductor wafer 10 from the ejection port of the nozzle portion 741a for about 30 seconds while the spinner table 711 is rotated at a revolution of 3,000 rpm, for example, whereby the liquid resin is spread to the peripheral portion of the semiconductor wafer 10 by centrifugal force to cover the surface of the semiconductor wafer 10. This liquid resin is cured with the passage of time to form a protective film 103 on the surface 10a of the semiconductor wafer 10, as shown in FIG. 8. The thickness of this protective film 103 may be about 0.05 to 10 μm. The resin for covering the surface 10a of the semiconductor wafer 10 is desirably a water-soluble resist such as PVA, (polyvinyl alcohol), PEG (polyethylene glycol) or PEO (polyethylene oxide). For example, the TPF8000 (trade name) supplied by Tokyo Ohka Kogyo Co., Ltd. can be favorably used. According to experiments conducted by the inventors of the present invention, when 30 ml of an aqueous solution (10%) of PVA (polyvinyl alcohol) was dripped on the surface of a semiconductor wafer having a diameter of 200 mm and spin coated, a 0.2 μm-thick protective film was formed.

Figure 6:
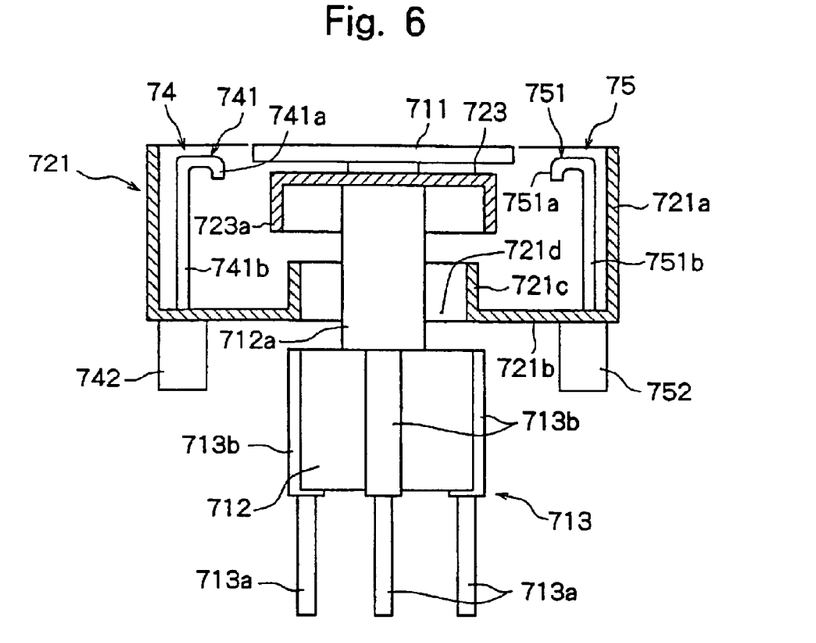
FIG. 6 is an explanatory diagram showing a state of the spinner table of the protective film forming/cleaning means shown in FIG. 5 being located at a workpiece take-in/take-out position.

After the protective film 103 is formed on the surface 10a of the semiconductor wafer 10 in the above protective film forming step, the spinner table 711 is moved to the workpiece take-in/take-out position shown in FIG. 6, and the suction-holding of the semiconductor wafer 10 held on the spinner table 711 is canceled. These semiconductor wafer 10 held on the spinner table 711 is carried onto the adsorption chuck 361 of the chuck table 36 constituting the chuck table unit 3 by the workpiece conveying means 16 and suction-held on the adsorption chuck 361. The chuck table 36 thus suction-holding the semiconductor wafer 10 thereon is moved along the guide rails 31 and 31 by the action of the moving means 37 and positioned right under the image pick-up means 6 mounted to the laser beam application unit 5.

After the chuck table 36 is positioned right under the image pick-up means 6, image processing such as pattern matching etc. is carried out to bring streets 101 formed on the semiconductor wafer 10 in a predetermined direction into alignment with the optical condenser 524 of the laser beam application unit 5 for applying a laser beam along the streets 101, by the image pick-up means 6 and a control means (not shown), whereby the alignment of a laser beam application position is performed. For the streets 101 that are formed on the semiconductor wafer 10 and extend in a direction perpendicular to the above predetermined direction, alignment of the laser beam application position is also carried out similarly. On this occasion, although the protective film 103 has been formed on the surface 10a, on which the street 101 is formed, of the semiconductor wafer 10, an image can be picked up with infrared radiation to carry out alignment from the front surface when the protective film 103 is not transparent.

After the streets formed on the semiconductor wafer 10 held on the chuck table 36 are detected and the alignment of the laser beam application position is carried out in the foregoing manner, the chuck table 36 is moved to a laser beam application area where the optical condenser 524 of the laser beam application unit 5 for applying a laser beam is located. In the laser beam application area, a laser beam is applied along the streets 101 of the semiconductor wafer 10 from the optical condenser 524 of the laser beam application unit 5 through the protective film 103 (laser beam application step).

The laser beam application step will be described hereinbelow.

Figure 9:
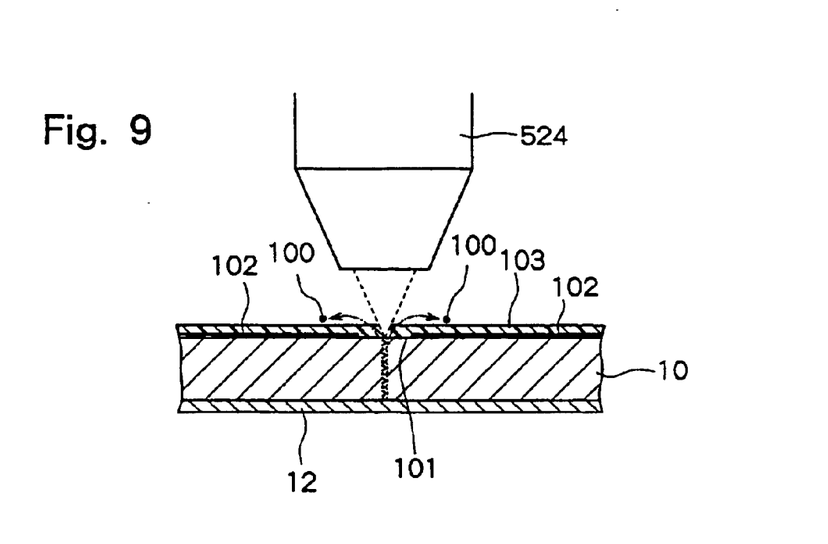
FIG. 9 is an explanatory diagram for showing the step of applying a laser beam by the laser beam processing machine shown in FIG. 1.
Figure 10:
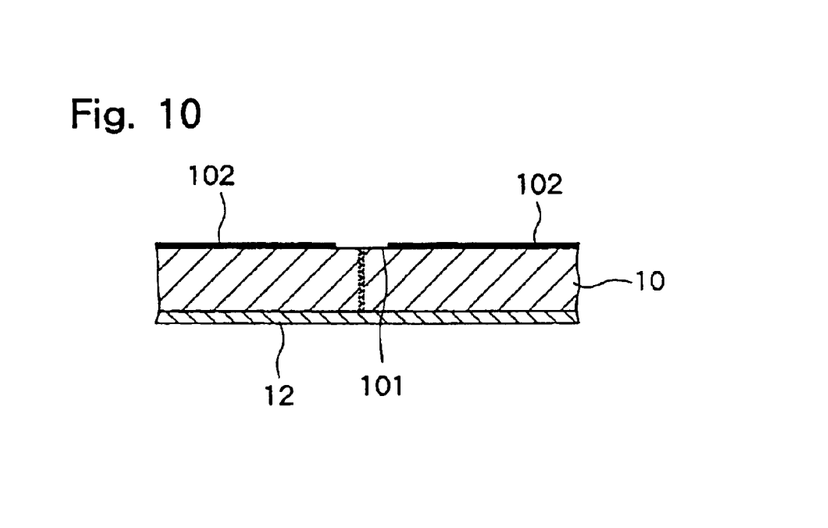
FIG. 10 is an enlarged sectional view of the principal portion of the semiconductor wafer as a workpiece processed by the laser beam processing machine shown in FIG. 1.

In the laser beam application step, the chuck table 36, namely, the semiconductor wafer 10 held on the chuck table 36 are moved in the direction indicated by the arrow X at a predetermined feed rate (for example, 200 mm/sec.) while a pulse laser beam is applied to a predetermined street 101 through the protective film 103 from the front surface side, which is the to-be-processed surface, of the semiconductor wafer 10 from the optical condenser 524 of the laser beam application unit 5 for applying a laser beam as shown in FIG. 9. In the laser beam application step, the following ultraviolet laser beam and infrared laser beam may be used.
(1) ultraviolet laser beam light source: YAG laser or YVO4 laser wavelength: 355 nm output: 3.0 W repetition frequency: 20 kHz pulse width: 0.1 ns diameter of focusing spot: 0.5 μm
(2) infrared laser beam light source: YAG laser or YVO4 laser wavelength: 1064 nm output: 5.1 W repetition frequency: 100 kHz pulse width: 20 ns diameter of focusing spot: 1 μm By performing the above laser beam application step, the semiconductor wafer 10 is divided along the streets 101. Even if debris 100 are produced by the application of a laser beam as shown in FIG. 9, these debris 10 are intercepted by the protective film 103 and do not adhere to the circuit 102, bonding pad, etc.

After the laser beam application step is carried out along a predetermined street as described above, the chuck table 36, namely, the semiconductor wafer 10 held on the chuck table 36 are index-moved by a distance between adjacent streets in the direction indicated by the arrow Y (indexing step) to carry out the above-mentioned laser beam application step. After the laser beam application step and the indexing step have been made on all the streets extending in the predetermined direction, the chuck table 36, namely, the semiconductor wafer 10 held on the chuck table 36 are turned at 90° to carry out the above-mentioned laser beam application step and indexing step along each of streets extending in a direction perpendicular to the above predetermined direction, thereby dividing the semiconductor wafer 10 into individual semiconductor chips.

After the semiconductor wafer 10 has been thus divided into individual semiconductor chips, the chuck table 36 holding the semiconductor wafer 10 is returned to the position where it first suction-held the semiconductor wafer 10, to cancel the suction-holding of the semiconductor wafer 10. Thereafter, the semiconductor wafer 10 is carried onto the adsorption chuck 711a of the spinner table 711 constituting the protective film forming/cleaning means 7 by the cleaning/conveying means 18, and is suction-held on the adsorption chuck 711a. The resin supply nozzle 741, cleaning water nozzle 751 and air nozzle 761 are situated at a stand-by position away from above the spinner table 711 as shown in FIG. 5 and FIG. 6.

After the semiconductor wafer 10 after processing is held on the spinner table 711 of the protective film forming/ cleaning means 7, the cleaning step is carried out. That is, the spinner table 711 is brought to the working position as shown in FIG. 7 and the electric motor 752 of the cleaning water supply means 75 is driven to bring the ejection port of the nozzle portion 751a of the cleaning water supply nozzle 751 to a position above the center portion of the semiconductor wafer 10 held on the spinner table 711 as shown by a two-dot chain line in the drawing. Cleaning water composed of pure water and air is then ejected from the ejection port of the nozzle portion 751a while the spinner table 711 is rotated at 800 rpm, for example. That is, the nozzle portion 751a is constructed by so-called "two-fluid nozzle", in which about 0.2 MPa pure water together with about 0.3 to 0.5 MPa air is supplied to the nozzle portion 751a thereby to eject pure water at the pressure of the air so as to clean the surface 10a, which is the to-be-processed surface, of the semiconductor wafer 10. On this occasion, the electric motor 752 is driven to swing the cleaning water supply nozzle 751 at a required angle covering a range of from the center portion of the semiconductor wafer 10 held on the spinner table 711 up to the outer peripheral portion of the semiconductor wafer 10 so that cleaning water ejected from the ejection port of the nozzle portion 751a of the cleaning water supply nozzle 751 hit against the above range of the surface 10a of the semiconductor wafer 10. As a result, since the protective film 103 formed on the surface 10a of the semiconductor wafer 10 is formed from a water-soluble resin as described above, the protective film 103 can be easily washed away and the debris 100 produced at the time of laser beam processing are also removed.

After the above cleaning step is completed, the drying step is carried out. That is, the cleaning water supply nozzle 741 is brought to a stand-by position, and the ejection port of the nozzle portion 761a constituting the air nozzle 761 of the air supply means 76 is brought to a position above the center portion of the semiconductor wafer 10 held on the spinner table 711. Air is then ejected from the ejection port of the nozzle portion 761a for about 15 seconds while the spinner table 711 is rotated at a revolution of 2,000 rpm, for example. On this occasion, the air nozzle 761 is caused to swing at a required angle so as to allow air ejected from the ejection port of the nozzle portion 761a of the air nozzle 761 to blow against the semiconductor wafer 10 held on the spinner table 711 in a range of from its center portion up to its outer peripheral portion. As a result, the surface of the semiconductor wafer 10 is dried.

After the cleaning and drying of the semiconductor wafer 10 after processing are over as described above, the revolution of the spinner table 711 is suspended and the air nozzle 761 of the air supply means 76 is brought to a stand-by position. The spinner table 711 is then brought to the workpiece take-in/take-out position shown in FIG. 6, and the suction-holding of the semiconductor wafer 10 held on the spinner table 711 is canceled. Thereafter, the semiconductor wafer 10 after processing, held on the spinner table 711 is carried to the positioning means 14 arranged on the temporary depot portion 14a by the workpiece conveying means 16. The semiconductor wafer 10 after processing carried to the positioning means 14 is stored at a predetermined position of the cassette 13 by the workpiece take-in/take-out means 15.

Since the protective film forming/cleaning means 7 in the illustrated embodiment comprises the spinner table mechanism, resin solution supply means, cleaning water supply means and air supply means as described above, the step of forming a protective film on the to-be-processed surface of a workpiece before processing and the cleaning and drying steps after processing can be carried out. Although the illustrated protective film forming/cleaning means 7 has both protective film forming and cleaning functions, the protective film forming means and the protective film cleaning means may be constructed separately.

Since the laser beam processing machine of the present invention is constituted as described above and comprises a protective film forming means for forming a protective film on the to-be-processed surface of the workpiece before laser beam processing, the processing method which can prevent the influence of debris produced by applying a laser beam to the workpiece can be carried out with a single apparatus. Therefore, according to the laser beam processing machine of the present invention, the factory space can be saved and the conveyance of the workpiece can be done efficiently.

We claim:

1. A laser beam processing machine comprising a chuck table for holding a workpiece and a laser beam application means for applying a laser beam to the workpiece held on the chuck table, wherein the machine further comprises a protective film forming means for forming a protective film on a surface of the workpiece to-be-processed before the laser beam processing, and wherein the protective film forming means comprises a spinner table that holds the workpiece and rotates, and a resin solution supply means for supplying a liquid resin solution to the to-be-processed surface of the workpiece held on the spinner table.

2. The laser beam processing machine according to claim 1, wherein the liquid resin solution supplied by the resin solution supply means is water-soluble.

3. The laser beam processing machine according to claim 1, wherein the protective film forming means comprises a cleaning water supply means for supplying cleaning water to the to-be-processed surface of the workpiece held on the spinner table.

4. The laser beam processing machine according to claim 1, wherein the machine comprises a cassette placing portion for placing a cassette for storing the workpiece, a workpiece take-in/take-out means for taking out the workpiece before processing from the cassette placed on the cassette placing portion and taking the workpiece after processing into the cassette, a temporary depot portion for temporarily storing the workpiece taken out by the workpiece take-in/take-out means, and a conveying means for carrying the workpiece temporarily stored on the temporary depot portion to the spinner table.

5. The laser beam processing machine according to claim 4, wherein the conveying means carries the workpiece having a protective film formed on the spinner table to the chuck table.

* * * * *